US006306732B1

(12) United States Patent
Brown (10) Patent No.: US 6,306,732 B1
(45) Date of Patent: Oct. 23, 2001

(54) METHOD AND APPARATUS FOR SIMULTANEOUSLY IMPROVING THE ELECTROMIGRATION RELIABILITY AND RESISTANCE OF DAMASCENE VIAS USING A CONTROLLED DIFFUSIVITY BARRIER

(75) Inventor: Dirk D. Brown, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/168,689

(22) Filed: Oct. 9, 1998

(51) Int. Cl.[7] ............................ H01L 21/326; H01L 21/479

(52) U.S. Cl. .................... 438/468; 438/627; 438/629; 438/742; 438/927

(58) Field of Search .................................. 438/626, 627, 438/629, 628, 638, 639, 643, 645, 468, 927, 666, 742

(56) References Cited

U.S. PATENT DOCUMENTS

| 5,486,492 | * | 1/1996 | Yamamoto et al. | 438/629 |
|---|---|---|---|---|
| 5,506,450 | * | 4/1996 | Lee et al. | 257/767 |
| 5,527,739 | * | 6/1996 | Parrillo et al. | 437/198 |
| 5,627,102 | * | 5/1997 | Shinriki et al. | 437/192 |
| 5,646,448 | * | 7/1997 | Klein et al. | 257/751 |
| 5,770,519 | * | 6/1998 | Klein et al. | 438/639 |
| 5,793,113 | * | 8/1998 | Oda | 257/774 |
| 5,904,565 | * | 5/1999 | Nguyen et al. | 438/687 |
| 5,933,753 | * | 8/1999 | Simon et al. | 438/629 |
| 5,966,634 | * | 10/1999 | Inohara et al. | 438/687 |
| 6,008,139 | * | 12/1999 | Pan et al. | 438/730 |
| 6,025,269 | * | 2/2000 | Sandhu | 438/688 |
| 6,040,243 | * | 3/2000 | Li et al. | 438/687 |

OTHER PUBLICATIONS

Tao et al., "Electromigration Characteristics of TiN Barrier Layer Material", IEEE Electron Device Letters, vol. 16, No. 6, Jun. 1995, pp. 230–232.*

Koizumi et al., "The Blocking Barrier Effect on Aluminum Electromigration Due to Titanium Layers in Multilayered Interconnects of LSI's", IEEE Electron Device Letters, vol. 16, No. 7, Jul. 1995, pp. 298–300.*

Fu et al., "Ti–Thickness Dependent Electromigration Resistance of the Al–Cu–Si/TiNx/TiSiy Barrier Contact System", VMIC Conference, Jun. 12–13, 1989, pp. 439–446.*

S. Wolf and R. N. Tauber, Silicon Processing for the VLSI Era, vol. 1, pp. 121–131 and 264–267 (1986).

* cited by examiner

Primary Examiner—Olik Chaudhuri
Assistant Examiner—Kurt Eaton
(74) Attorney, Agent, or Firm—Foley & Lardner (57) ABSTRACT

An apparatus for improving electromigration reliability and resistance of a single- or dual-damascene via includes an imperfect barrier formed at the bottom of the via, and a stronger barrier formed at all other portions of the via. The imperfect barrier allows for metal atoms, such as copper atoms, to flow therethrough when the electromigration force pushes the metal atoms against the barrier. That way, the metal atoms that are pushed away from the downstream side of the barrier are replaced by metal atoms that flow through the barrier from the upstream side of the barrier. The imperfect barrier may be formed by biasing a wafer, and having the atoms resputter from the bottom of the via and adhere to the sidewalls of the via. The imperfect barrier may also be formed by a two-layered barrier, where a first layer corresponds to a good step coverage, poor barrier, and where the second barrier corresponds to a poor step coverage, good barrier. The imperfect barrier may also be formed by depositing the barrier conformally, and providing a directional etch to the portions of the barrier that are deposited to the bottom of the via.

5 Claims, 12 Drawing Sheets

METHOD AND APPARATUS FOR SIMULTANEOUSLY IMPROVING THE ELECTROMIGRATION RELIABILITY AND RESISTANCE OF DAMASCENE VIAS USING A CONTROLLED DIFFUSIVITY BARRIER

BACKGROUND OF THE INVENTION

1. Field of the Invention

The present invention relates to a method and apparatus for improving electromigration reliability and resistance of damascene and dual-damascene vias using a controlled diffusivity barrier. In particular, the present invention relates to a method and apparatus for providing an imperfect barrier to allow for some leakage of atoms therethrough in order to reduce the possibility of void formation due to electromigration in semiconductor devices.

2. Description of the Related Art

As semiconductor device geometries continue to scale down below 0.5 $\mu$m, and approach 0.18 $\mu$m and smaller minimum feature sizes, the metal interconnect lines that carry current between devices on a chip begin to dominate the overall circuit speed. In order to enhance interconnect speed and reliability, the semiconductor industry has been moving away from blanket deposition and etch of aluminum (Al)-based metallizations towards damascene and dual-damascene interconnect structures with copper (Cu)-based metallizations. Cu is a lower resistivity metal than Al, which results in a lower RC-interconnect delay. Cu has also been shown to have superior electromigration performance over Al. However, Cu interconnects are more difficult to process, primarily because: a) it is more difficult to etch, and b) it acts as a deep level trap in silicon (Si)-based devices.

While Al does have its benefits, including low melting temperature (660° C.) and its low eutectic temperature with Si (577° C.), Al interconnects begin to form hillocks at relatively low processing temperatures (i.e., above 300° C.), as well as the electromigration problem discussed above. Attempts to alleviate these problems involve the addition of alloy materials to Al or the formation of multilayer-Al conductor structures. The addition of other metals to form Al alloys, however, typically results in the degradation of one or more of the Al characteristics, such as degraded resistivity, corrosion resistance, etchability, and/or bondability. For these reasons, copper-based damascene and dual-damascene interconnects are now being utilized instead of the standard Al-based interconnects for semiconductor devices.

Figure 1A:
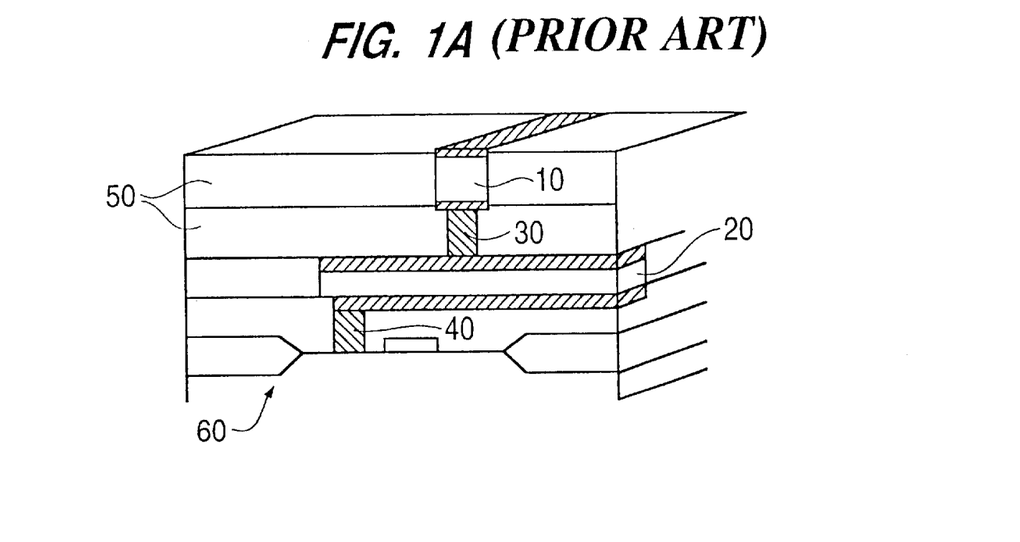
FIG. 1A is a diagram of a conventional Al-interconnect.

FIG. 1A shows a conventional interconnect structure, with Al-alloy in a $SiO_2$ dielectric, with tungsten (W) plugs as vias. The Al-alloy stack is shown by regions 10, 20, and the tungsten plugs are shown by regions 30, 40. The Al-alloy stack 10, 20 is formed in a $SiO_2$ layer 50. As a result, connectivity down to the substrate 60 can be provided, but with the problems as discussed above.

One such problem with Al-alloy interconnects, or any other type of interconnects in small-sized geometries, is electromigration. Electromigration is the motion of ions of a conductor (such as Al or Cu) in response to the passage of current through it. These ions are moved downstream by the force of the electron wind. A positive divergence of the ionic flux leads to an accumulation of vacancies, or voids, in the metal. Such voids may grow to a large enough size so as to cause an open-circuit failure of the conductor line.

The problem of electromigration is discussed in detail in Silicon Processing for the VLSI Era, Vol. 2, by S. Wolf et al., pages 264–267. In particular, S. Wolf notes that the failure rate due to electromigration is increased when the current density in the conductor line is increased. Due to smaller-sized semiconductor devices being formed (geometries less than 0.5 $\mu$m), high current densities in interconnect lines are a reality that must be addressed.

Techniques for increasing the resistance of an interconnect process to electromigration failure for standard Al-based interconnects include: a) adding Cu (0.5–4%) to the Al film; b) adding titanium (Ti) (0.1–0.5%) to the Al film; c) using a layered Al film structure, with a highly electromigration resistant metal (e.g., Ti, W, or Mo) as the central layer of a trilayer film; d) planarizing the intermetal dielectric, to eliminate thinning of the conductor lines as they cross steps, e) selectively depositing a layer of CVD tungsten (W) over the Al lines, f) avoiding the use of Al:Si when fabricating narrow, multilevel-metal structures, and g) replacing the Al metallization with a more electromigration-resistance metal, such as W or Mo. None of these techniques have been completely successful.

As discussed above, the semiconductor industry is moving away from Al and towards Cu as an interconnect metal. The preferred way to process Cu interconnects is to: a) etch a trench or via into a dielectric material, b) deposit the interconnect metallization to fill the trench or via, and then c) polish the metal back to remove any metal from the field (surface of the wafer). The resulting metal-filled trenches and vias form the electrical interconnect.

Forming an interconnect structure by filling a trench or via with metal is known as a damascene process. If a trench and underlying via are filled simultaneously, it is known as a dual-damascene process.

Figure 1B:
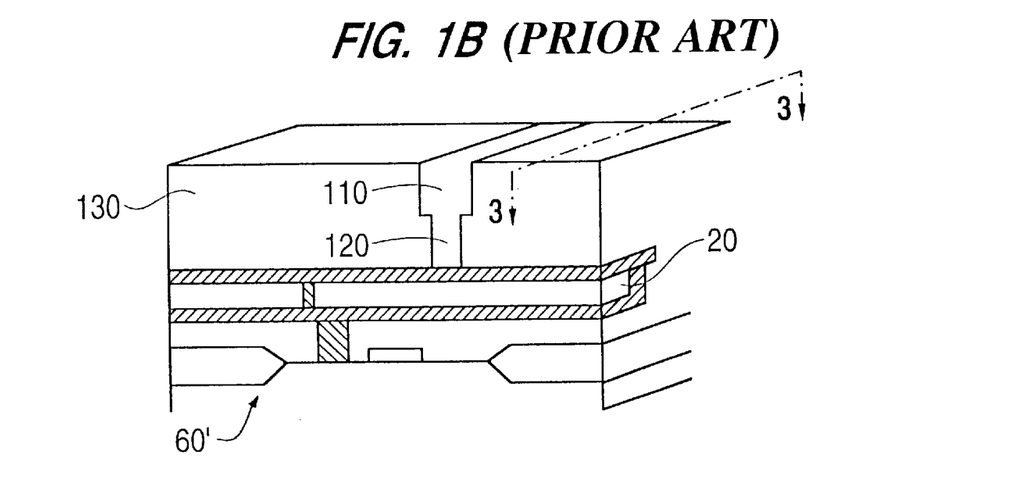
FIG. 1B is a diagram of a conventional dual damascene interconnect.

FIG. 1B shows a dual-damascene interconnect structure, with a trench 110 and a via 120 formed in a low-k dielectric layer 130. After the forming of the trench 110 and the via 120, metal (e.g., copper) is deposited into these regions, and then a polishing step is performed, as explained above.

A refractory metal, such as Ti, TiN, Ta, TaN, or WN, is typically deposited prior to the deposition of Al or Cu-based metallizations in damascene processing. This barrier layer prevents Al or Cu diffusion into the surrounding dielectric, and improves the quality of the metal/dielectric interface. The refractory metal acts as a diffusion barrier, which prevents the intermixing of materials from the metal layer and the surrounding dielectric. A diffusion barrier used in integrated circuit fabrication is typically a thin film inserted between an overlying metal and an underlying metal, or between two metals in a multilevel metal system. The optimal characteristics of a diffusion barrier are discussed in detail in Silicon Processing for the VLSI Era, Vol. 2, by S. Wolf et al., pages 121–131, mentioned above. By having a diffusion barrier that is formed by a metal, such as a refractory metal, the copper interconnect metal is prevented from diffusing into the adjacent dielectric material, where it may work its way down to the transistors on the wafer, thereby causing damage to the transistors.

In order to obtain adequate step coverage in high aspect ratio trenches and vias, several deposition techniques have been developed to give very directional deposition. These deposition techniques include using ionized metal plasma (IMP), having a high target-to-substrate distance, and using a hollow cathode magnetron. Typically, these deposition techniques are optimized to give the maximum step coverage on all surfaces inside the damascene structure.

SUMMARY OF THE INVENTION

It is an object of the invention to improve electromigration reliability of damascene vias.

It is another object of the invention to improve resistance of damascene vias.

It is yet another object of the invention to lessen the likelihood of voids in interconnects forming as a result of electromigration.

The above-mentioned objects of the invention may be achieved by a first method of forming a diffusivity barrier for a damascene interconnect structure that includes a via and a trench. The first method includes a step of depositing a barrier metal conformally onto the via and the trench. The first method also includes a step of directionally etching the deposited barrier metal to thereby etch surfaces of the via that are substantially perpendicular to a direction in the barrier metal was deposited in the first step.

The above-mentioned objects of the invention may also be achieved by a second method of forming a diffusivity barrier for a damascene interconnect structure that includes a via and a trench formed on a substrate. The second method includes a step of biasing the substrate with a voltage. The second method also includes a step of applying barrier metal atoms onto the biased substrate by sputtering. A subset of the barrier metal atoms that are applied to the biased substrate bounce off a bottom surface of the via and adhere to sidewalls of the via, to thereby form a thicker barrier metal layer on the sidewalls of the via than on the bottom surface of the via.

The above-mentioned objects of the invention may also be achieved by a third method of forming a diffusivity barrier for a damascene interconnect structure that includes a via and a trench formed on a substrate. The third method includes a step of applying a first barrier metal onto the via and the trench by a first deposition process. The third method also includes a step of, after the first step, applying a second barrier metal onto the via and the trench by a second conformal process.

The above-mentioned objects of the invention may also be achieved by a damascene interconnect structure for a semiconductor device. The structure includes a dielectric layer, a via filled with a conductive metal, the via being disposed in the dielectric layer, and a trench filled with the conductive metal. The trench is disposed in the dielectric layer, and is connected to the via so as to provide an electrical connection to another line that is directly coupled to the via but is not directly coupled to the trench. The structure also includes a diffusion barrier disposed on an entire outer peripheral surface of the via including sidewalls of the via that contact with the dielectric layer and a bottom surface of the via that contacts with the trench. The diffusion barrier prevents the conductive metal to diffuse out of the via and into the dielectric layer. In the structure according to the invention, characteristics of the diffusion barrier are different at the sidewalls of the via with respect to the bottom surface of the via.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENTS

A preferred embodiment of the invention will be discussed in detail below with reference to FIGS. 2A–10D. FIGS. 2A–2D illustrate the steps of a dual damascene process that may be used to form a trough and a via, which is then filled with a diffusivity barrier and a conductive metal to provide an interconnect structure.

Figure 2A:
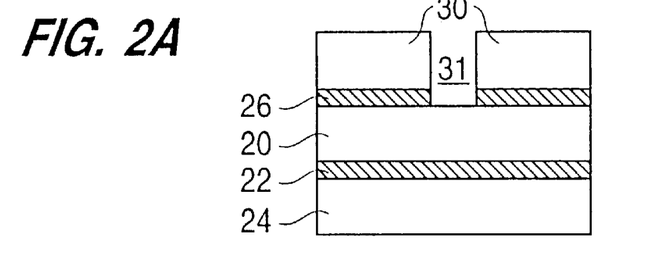
FIGS. 2A–2D are diagrams explaining a process for forming a via and a trough by a dual damascene process.

FIG. 2A illustrates an oxide layer 20 that is deposited (by TEOS oxide deposition) on top of a silicon nitride (SiN) layer 22. The SiN layer 22 has a thickness of approximately 50 nm, and the oxide layer has a thickness of approximately 500 nm. The SiN layer 22 is deposited on top of a copper layer 24, to which an electrical connection is to be made. Another SiN layer 26 is deposited on top of the oxide layer 20. The SiN layer 26 has a thickness of approximately 100 nm. A layer of photoresist (UV5) 30 is spin coated on top of the SiN layer 26, exposed through a mask (not shown) containing a contact hole pattern, and developed. An etch opening 31 is thus formed, to thereby form a via hole. A portion of the SiN layer 26 that is directly below the etch opening 31 is also etched away.

Figure 2B:
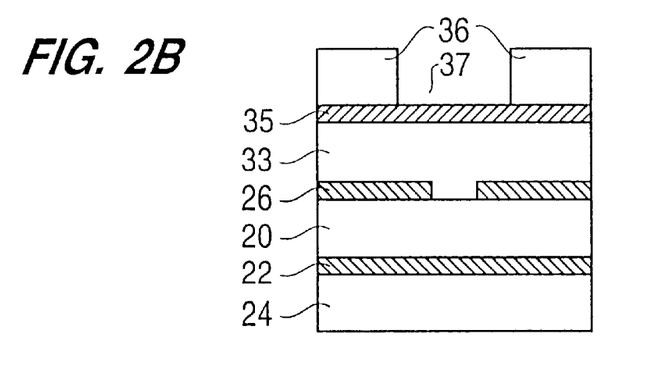

Referring now to FIG. 2B, another oxide layer 33 is deposited (TEOS deposition) above the SiN layer 26, and has a thickness of approximately 500 nm. A bottom antireflective coating (BARC) coat (CD11) 35 is applied on top of the oxide layer 33.

Next, a layer of photoresist 36 is applied a second time. The photoresist 35 is then exposed through a mask (not shown) and developed to form an etch opening 37.

Figure 2C:
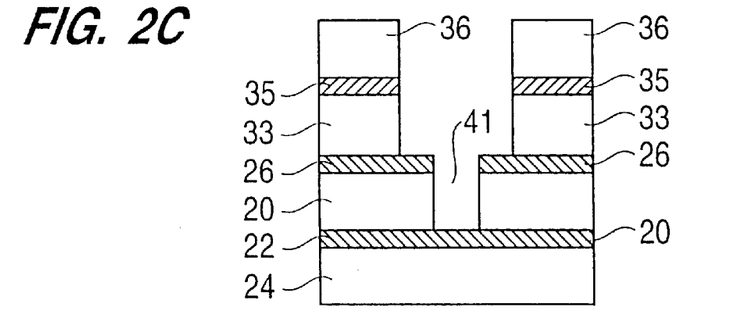

Referring now to FIG. 2C, a BARC etch is performed, and then a 1000 nm TEOS etch is performed, which stops on the SiN layer 22. As a result, a contact hole 41 is formed.

Figure 2D:
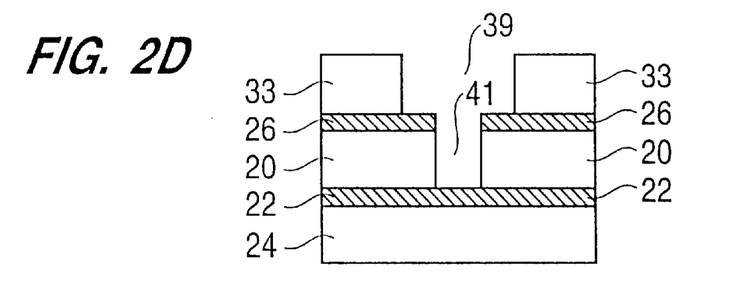

Referring now to FIG. 2D, using the remaining photoresist as an etch mask, the exposed portions of the SiN layer 22 and the SiN layer 26 are removed (by nitride-sensitive etching, for example) to form a wiring trough 39. This etch step is known as a damascene etch step. The remaining photoresist is removed and the contact hole 41 and the wiring trough 39 are filled with a refractory metal (not shown) that acts as a diffusion barrier, and then a conductive metal (not shown), such as copper, is provided to the substrate. After a polishing step, the copper is located only in the contact hole 41 and the wiring trough 39.

Figure 3:
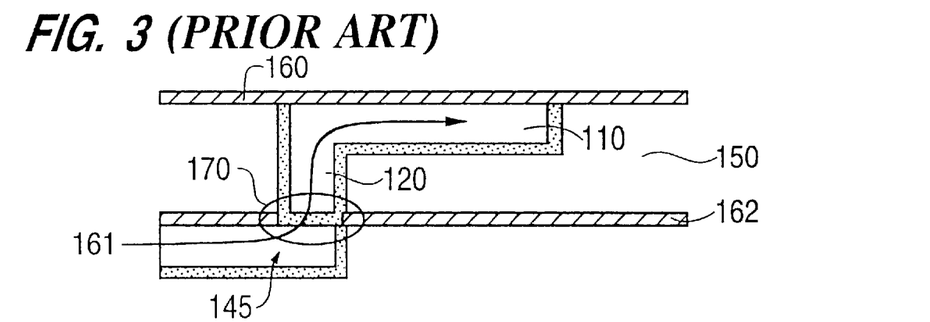
FIG. 3 is a cross-sectional view of the dual damascene interconnect of FIG. 1B.

FIG. 3 shows a cross-sectional view taken along line 3—3 of FIG. 1B, in which the trench 110 and via 120 are shown. A refractory metal, such as titanium (Ti), titanium nitride (TiN), tantalum (Ta), or tantalum nitride (TaN), is deposited into the trench 110 and the via 120, providing a barrier between the metal (Cu) to be deposited into the trench 110 and the via 120, and the low-k dielectric layer 150. The thickness of the barrier layer in conventional damascene vias is typically a uniform thickness of from 50 to 400 angstroms. Due to the barrier being provided at all portions of the via and the trench, even at the bottom of the via, the electrons that flow through the metal interconnects must pass through the barrier metal. Also shown in FIG. 3 are silicon nitride (SiN) layers 160, 162 which act as caps to prevents the metal in the trough and via from diffusing into layers above and below.

The barrier metal is a high-resistivity metal, which may cause problems that may result in void and/or hillock formation, as will be discussed in detail below. Conventional damascene vias have been constructed without this problem being recognized. In particular, due to the small-sized interconnect structures that are being formed for semiconductor devices at present, the current density is very high, and the Cu atoms are pushed by the electrons along a direction of current flow. The direction of current flow is shown by the arrow line 161 in FIG. 3. Due to the diffusion barrier properties of the barrier metal formed at the bottom of the via, the Cu atoms are blocked from passing through the barrier, thereby forming an accumulation of Cu atoms just upstream of the barrier, which corresponds to the lower half of the circled-region 170 in FIG. 3.

Figure 4:
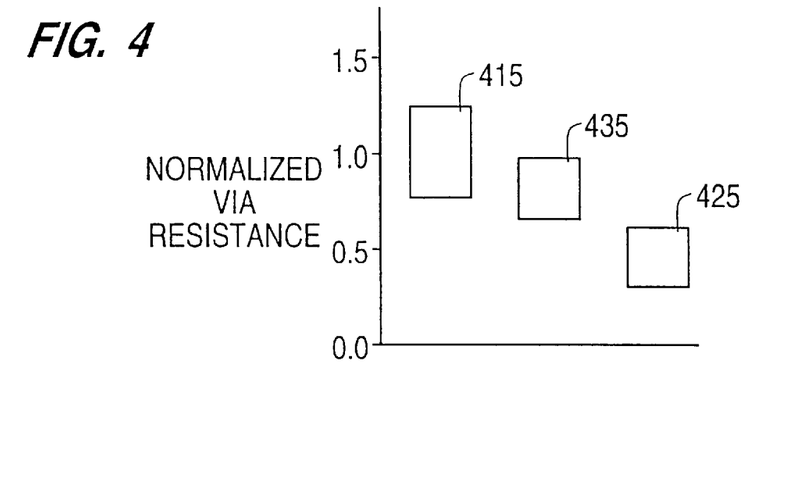
FIG. 4 is a chart showing resistance versus barrier coverage for three different types of barriers.

FIG. 4 is a plot of normalized via resistance for different types of barrier layers applied to the bottom surface of a via. The low bottom coverage range 425 was obtained using ionized metal plasma (IMP) processing and backsputtering atoms off the bottom of the via. The high bottom coverage range 415 was obtained using standard physical vapor deposition (PVD) processing. As seen from the data plotted in FIG. 4, high bottom coverage range of 0.7 to 1.2, normalized, corresponds to a high resistance barrier layer, while low bottom coverage range of 0.3 to 0.7, normalized, corresponds to a low resistance barrier layer. Also shown in FIG. 4 is a moderate bottom coverage via resistance range 435 for a moderate resistance barrier layer. The moderate resistance layer is formed by controlling the barrier metal thickness (using IMP sputtering, for example) to obtain an intermediate thickness. As is readily apparent from FIG. 4, there is a tradeoff between barrier strength (that is, effective separation between the metal and the surrounding dielectric), and amount of resistance that may cause problems due to electromigration, as will be explained in detail below.

Figure 5:
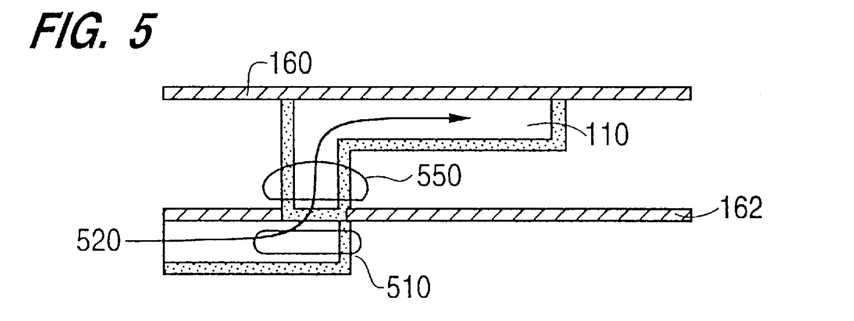
FIG. 5 is a diagram explaining the electromigration problem associated with damascene-based interconnects.

FIG. 5 shows areas in the dual-damascene structure in which electromigration may cause problems to occur. The circled-area 510 is an area upstream from the bottom of the via, where the barrier metal is formed. This area is upstream in a sense of current or electron movement, shown by the arrow line 520 in FIG. 5. Electrical current is usually defined as being in the direction of positive charge, i.e., in the opposite direction of the flow of electrons. The direction of electrical current flow in FIG. 5 is opposite to the direction of electron movement shown by the arrow line 520. Electrons push the metal atoms down the line, in a direction of the arrow line 520. This is due to the small size of the interconnect line, as well as the high density of current flow. Due to the electron density being so high in the interconnect regions, the electrons collide with the metal atoms, causing a "pushing" of the metal atoms down the line in a direction of the flow of current. This is know as the "electron wind" force, as discussed above.

Due to electromigration, metal atoms are accumulated in the circled-area 510, as they pile up at the barrier that is located at the bottom of the via. Extrusion formation is likely to occur in the circled-area 510. Atoms are depleted in the region indicated by the circled-area 550, which is located just downstream of the barrier. Depletion occurs due to the metal atoms being carried away by the electron wind, and which cannot be replaced because of the barrier that prevents the atoms upstream of the barrier from passing therethrough.

A tensile force forms in region 550 because atoms are depleted. In that region 550, there are fewer atoms spread farther apart in the same overall volume. Similarly, there is a compressive stress that forms in region 510 because atoms are being accumulated. The tensile force actually draws atoms upstream from region 110 to region 550 in order to relax the tensile stress. That is, the atoms would prefer to be equally distributed, so there is a driving force due to the stress (concentration) gradient to move atoms upstream so as to relax the tensile stress. This counteracts the electromigration driving force and decreases the damage due to electromigration. However, the large tensile stress can also lead to cracking and void nucleation, which may result in improper circuit operation.

As discussed above, electromigration results in a net depletion of atoms on the anode side of the barrier, and a net accumulation of atoms on the cathode side of the barrier. This effect is analogous to a tungsten via in a traditional interconnect. structure (see FIG. 1A). Damage in an interconnect due to electromigration typically occurs in these regions of flux divergence.

Figure 6A:
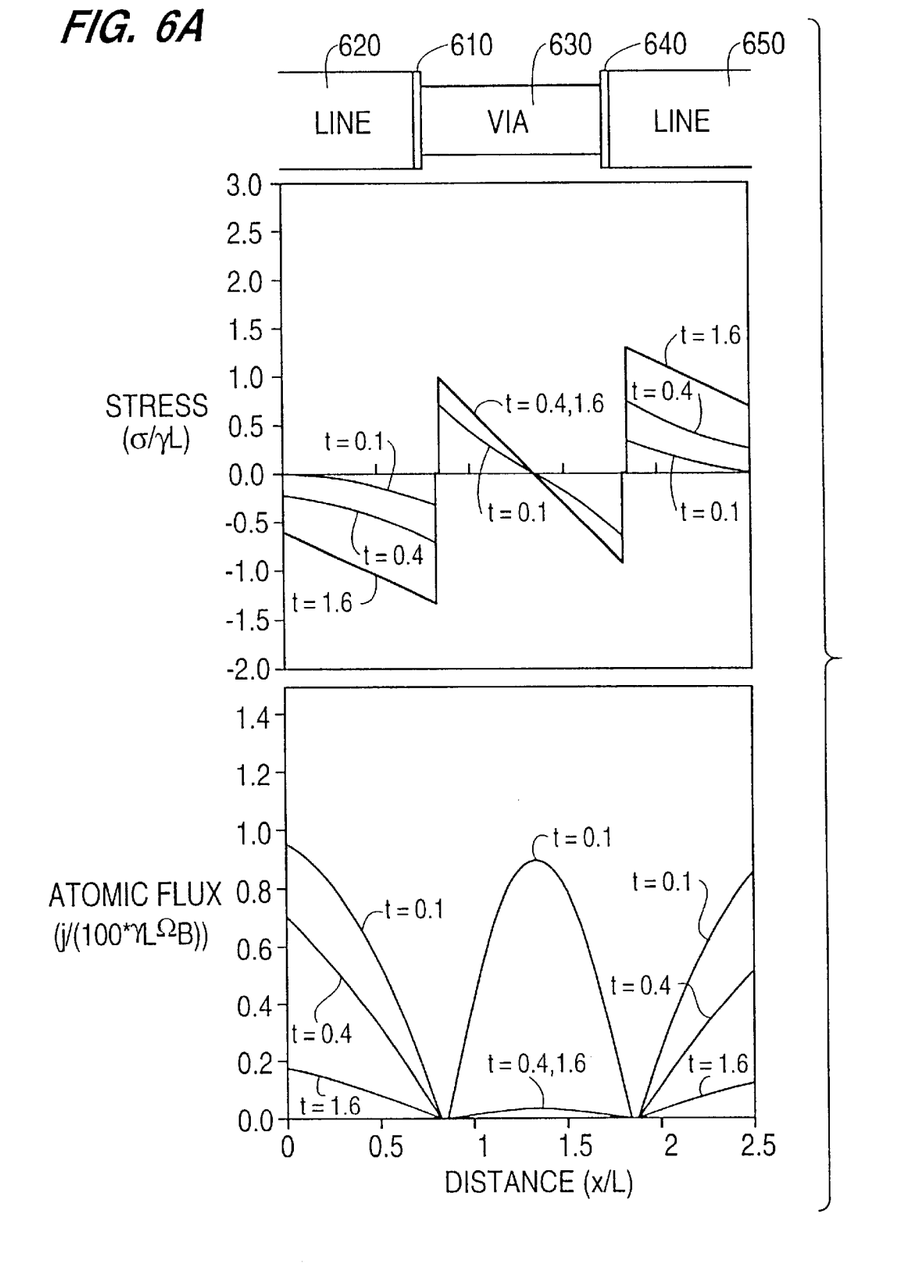
FIG. 6A is a structural diagram, stress plot and atomic flux plot for a perfect diffusion barrier.
Figure 6B:
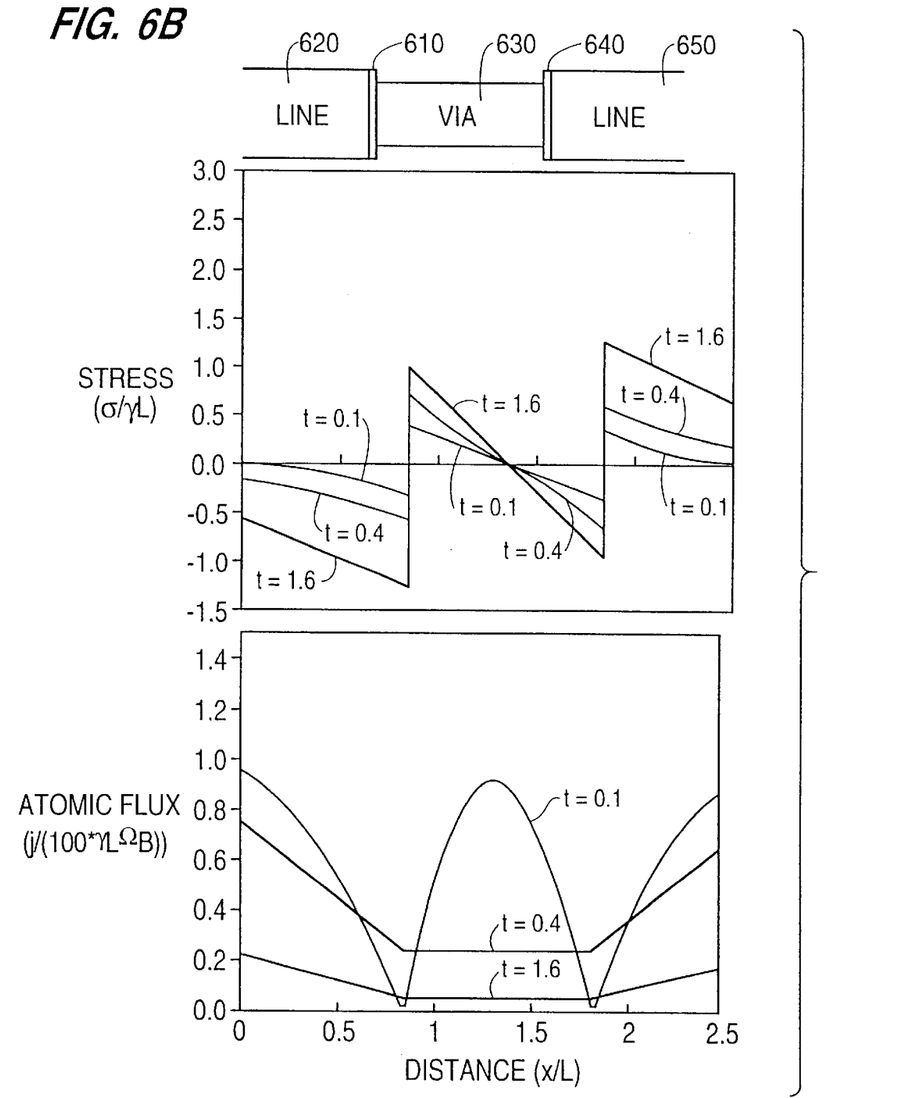
FIG. 6B is a structural diagram, stress plot and atomic flux plot for a moderate diffusion barrier.
Figure 6C:
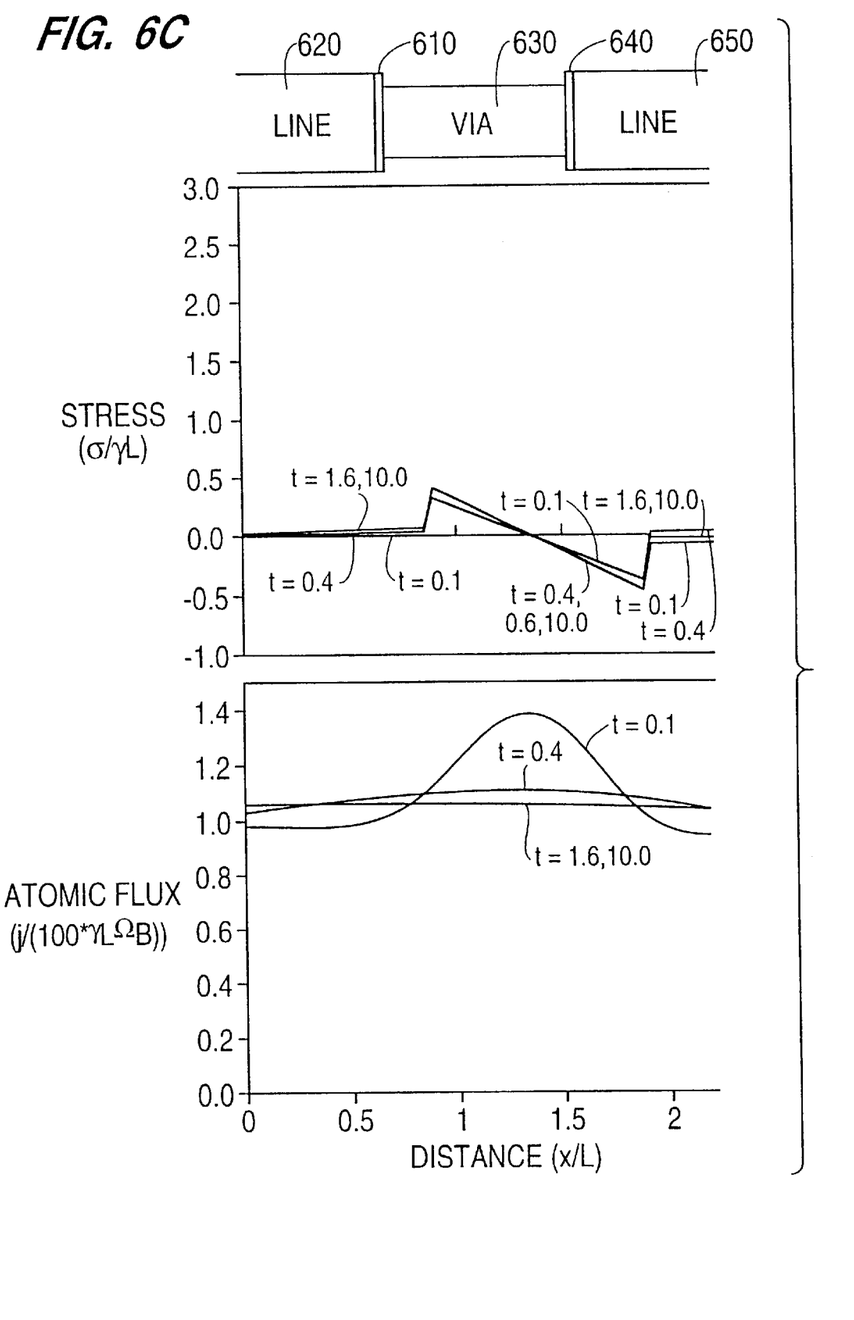
FIG. 6C is a structural diagram, stress plot and atomic flux plot for a poor diffusion barrier.

FIGS. 6A, 6B and 6C are plots of stress and atomic flux for three different types of diffusion barriers that are provided for an interconnect structure created by a damascene process. A refractory metal barrier layer exists at a first region 610 between a first metal line 620 and a via 630, and another refractory metal barrier layer exists at a second region 640 between the via 630 and a second metal line 650 that is downstream (with respect to a direction of current flow) of the first metal line 620. FIG. 6A shows the stress levels and atomic flux levels for a "perfect" diffusion barrier (i.e., no diffusion of metal atoms through the barrier), FIG.

6B shows the stress levels and atomic flux levels for a "moderate" diffusion barrier (100 times slower in barrier), and FIG. 6C shows the stress levels and atomic flux levels for a "poor" diffusion barrier (10 times slower in barrier). The data values are obtained at three different times, t=0.1, t=0.4, and t=1.6. In these figures, "time" is plotted in normalized units of $Kt/L^2$, where K is the effective bulk modulus, t is time, and $L^2$ is the length of the via squared.

The plots of FIGS. 6A–6C were obtained from computer models of single-damascene structures, so as to determine the effect of varying the barrier diffusivity at the bottom of a damascene via. Details of the computer models used to form these plots can be found in a first reference written by M. A. Korhonen et al., Journal of Applied Physics, 73(8), pages 3790–3799 (1993); and in a second reference authored by D. D. Brown, Stress and Current-Induced Phenomena in Thin, Constrained Metallizations, Ph.D Dissertation, Dept. of Materials Science and Engineering, Cornell University (1996). In these figures, a trench for a conductor line or wire is formed in a dielectric layer, then a barrier metal is deposited into the trench as a coating layer, and then copper metal is deposited into the barrier-metal-coated trench. After the line is formed, another layer of dielectric is deposited thereabove, then a hole for a via is formed in this other dielectric layer, then a barrier metal is deposited in to the hole as a coating layer, and then copper metal is deposited into the barrier-metalcoated via hole. The line located above the via (to the left of the via in the figures) is formed in a similar manner to the other line.

In FIGS. 6A–6C, the negative stress values correspond to a compressive stress, and the positive stress values correspond to a tensile stress. Current or electron flow is from the left to the right in these figures. Of course, although the line/via/line interconnect structure is shown as being horizontally situated, one skilled in the art will recognize that this is not typically the case with respect to a metal interconnect pattern on a semiconductor substrate, and is only shown this way to facilitate understanding so as to provide a simple lining up the stress forces and atomic flux values with respect to the particular portions of the lines and the via where these values occur.

Starting with FIG. 6A, which shows the stress levels and the atomic flux density for a perfect diffusion barrier, at the start of current flow, metal atoms begin to accumulate at the left side of the first barrier 610. This accumulation causes a compressive stress in the region of the line 620 that borders the first barrier 610. The metal atoms are not being able to pass through the first barrier 610 as a result of the high density of metal atoms (Ti, TiN, Ta, or TaN) of the first barrier 610. The compressive stress increases over time, due to more and more atoms accumulating at the end of the line 620, as seen in FIG. 6A. A compressive stress may lead to the formation of extrusions or hillocks.

The material in the portion of the via 630 that is adjacent to the first barrier 610 experiences a tensile stress, with the tensile stress being caused by the atoms being pulled away in the region. This tensile stress causes the atoms to be pulled away from the first barrier 610 and towards the right side of the via 630 as shown in the figure. Such a tensile stress may lead to the formation of voids in the portion of the via 630 adjacent to the first barrier 610.

A large stress gradient occurs at the first barrier, due to a strong compressive force (shown as the left-most singularity in the stress plot of FIG. 6A) on the left side of the first barrier 610 and a strong tensile force on the right side of the first barrier 610.

The electromigration force causes the copper atoms to move from left to right as shown in FIG. 6A, but the stress gradient causes the copper atoms to want to move in the opposite direction, so as to minimize the energy created by the atomic flux. The electromigration force and the stress gradient are two different forces that counteract each other. Based on these two counteracting forces, a steady state condition is reached in the via 630, as seen by the nearly-zero low atomic flux value for t>0.4 in FIG. 6A, as well as the non-changing stress level in the via for t=0.4 and t=1.6. At the second barrier 640, metal atoms are pushed to the left side of the second barrier 640 to cause a compressive stress, and a tensile stress is built up at the right side of the second barrier 640. A stress gradient occurs in a region of the second barrier 640, as seen in FIG. 6A.

The large positive stress values cause voids to form, especially in the region adjacent to the right side of the first and second barriers 610, 640, where metal (Cu) atoms are pushed away from that region due to electromigration, and where no replacement atoms are provided to fill in the gaps due to the loss of atoms caused by electromigration. If small voids are already present in the via and/or in the lines, then these voids may become enlarged to form large-enough voids that affect current flow, resulting in an open circuit. Also, due to the tensile stresses and the electromigration force, voids may be formed in the via and in the lines even if none were present prior to current flow. This formation of voids where none previously existed may be due in part to the high-level stresses causing cracks in the passivation layer.

FIG. 6B shows the tensile forces and atomic flux over time for a moderate diffusion barrier, in which the movement of metal atoms through each barrier (note that there are two barriers for a single-damascene case, one shown to the left of the via and one shown to the right of the via in FIG. 6B, which are typically physically located below and above the via in the semiconductor device) is 100 times slower than the movement of metal atoms in the lines (the movement being due to the electron wind). In FIG. 6B, the compressive and tensile stresses do not reach the steady state condition as in FIG. 6A. This is due to some diffusion of atoms from the first line 620 through the first barrier 610 and into the left side of the via 630, and the diffusion of atoms from the right side of the via 630 through the second barrier 640 and into the second line 650. As a result of this diffusion, the stress build-up is a little bit smaller than the build-up in the perfect barrier case.

FIG. 6C shows the tensile forces and atomic flux over time for a poor diffusion barrier, in which the diffusion of metal atoms through each barrier is 10 times slower than that in the lines. As can be clearly seen from FIG. 6C, the compressive and tensile stresses are much lower than those of FIGS. 6A and 6B, but with the atomic flux being larger due to the greater flow of metal atoms through the poor barriers as a result of electromigration.

From FIGS. 6A–6C, a poor barrier generally provides the best results in terms of stress reduction at the via, and increases the reliability of the interconnect at the via due to the lessened likelihood of voids being formed due to electromigration and tensile/compressive stress build-up. However, having a poor barrier will not necessarily always result in the best results for the interconnect structure as a whole, due to the greater atomic flux which can result in damage at the far (cathode) end of a line connected to the via. The proper choice of a barrier strength is decided based on the particular interconnect conditions that exist and the interconnect areas that are considered to be the most critical.

The present invention is directed to a controlled diffusivity barrier, with the amount of diffusivity being based on the particular structure of the interconnect.

Referring back to FIG. 3, a barrier material is deposited on all exposed areas of the via 120 and the trench 110. The barrier metal is also deposited onto the bottom surface of the via 120, where it causes a blockage in the flow of metal atoms during electromigration, which may lead to voids and/or hillocks being formed in the conductive lines and vias. The bottom surface of the via 120 connects to another metal (Cu) line 145, and so there is no real need to have a diffusivity barrier between the via 120 and the line 145, since the conductive material in the via 120 is the same as the conductive material in the lower line 145.

Figure 7A:
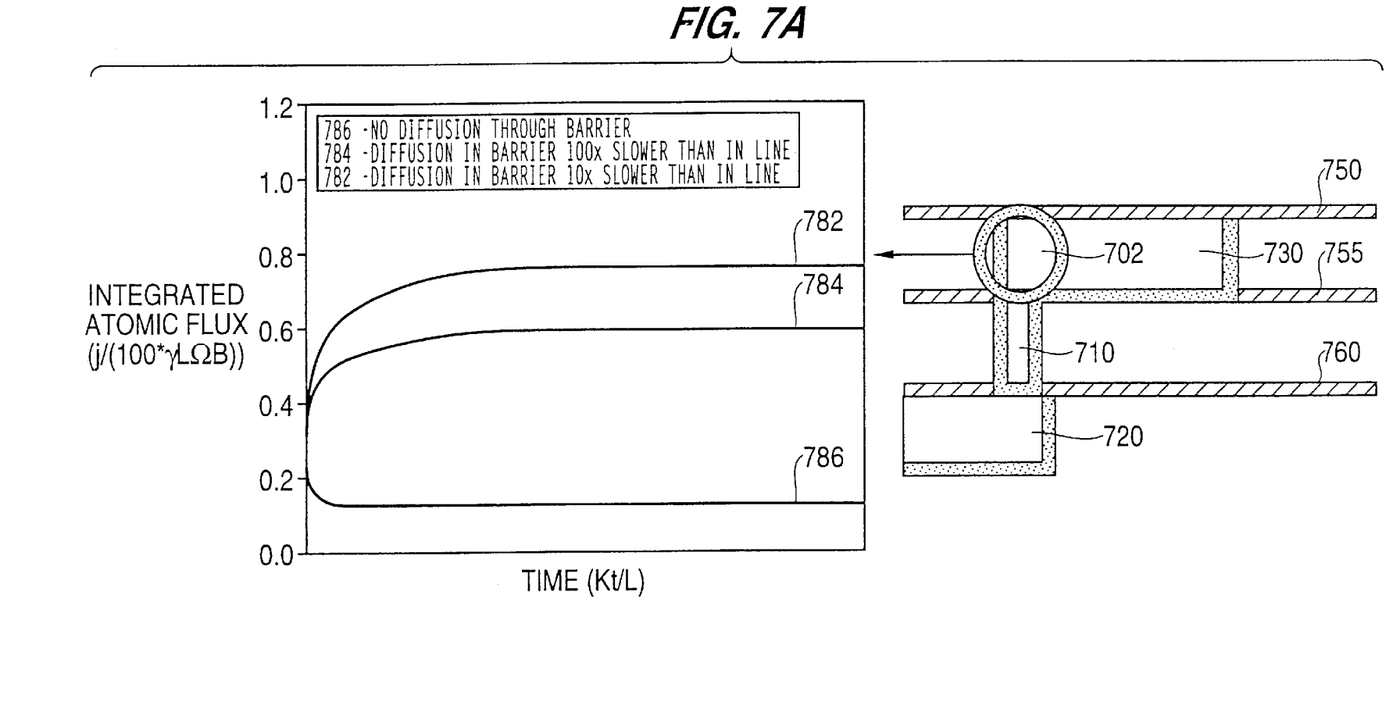
FIG. 7A is a structural diagram and atomic flux plot for a top portion of a via formed by a single damascene process.
Figure 7B:
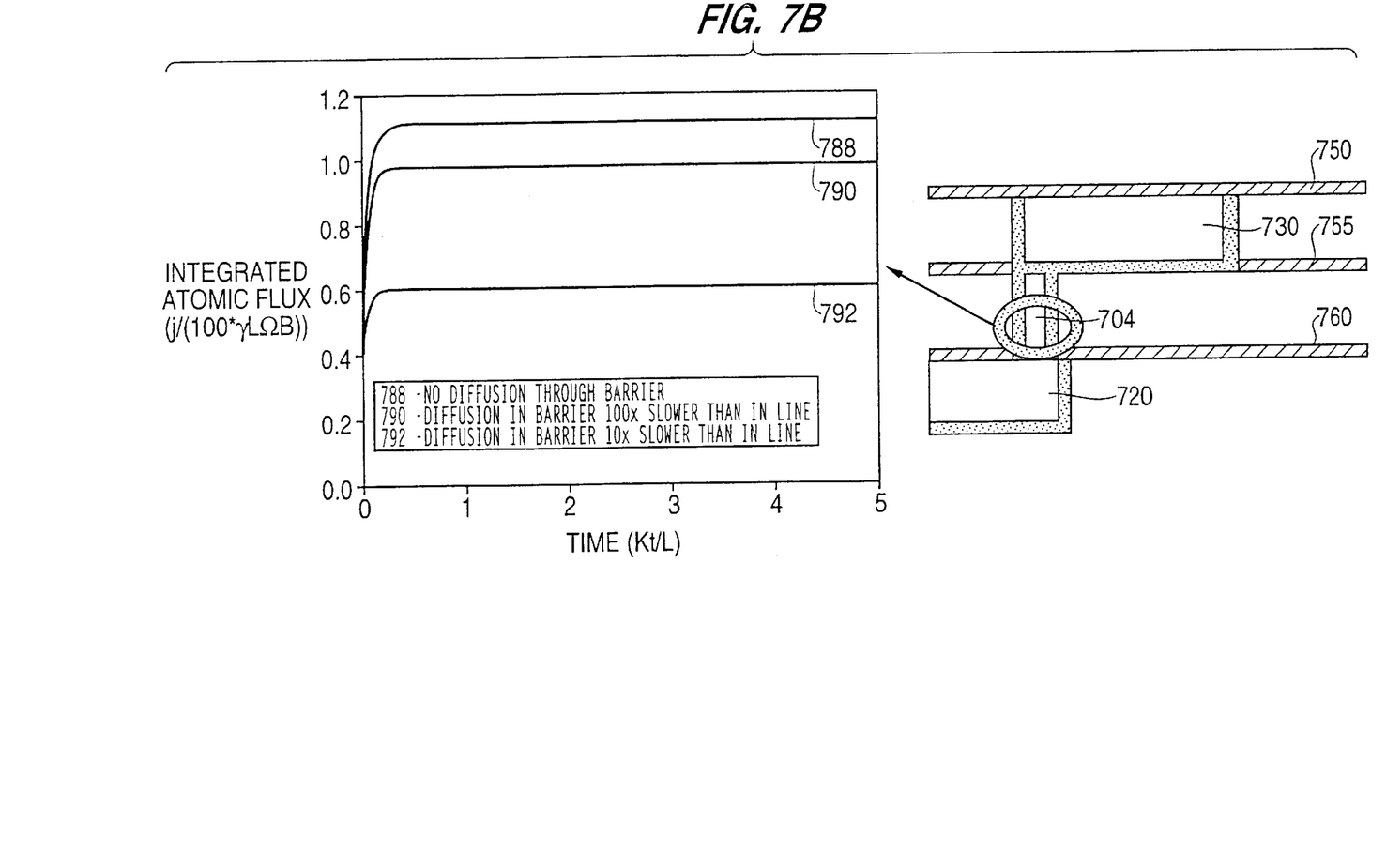
FIG. 7B is a structural diagram and atomic flux plot for a bottom portion of a via formed by a single damascene process.

FIGS. 7A and 7B show the integrated atomic flux for a single damascene interconnect structure. FIG. 7A corresponds to the integrated atomic flux at a region 702 just above the via 710, and FIG. 7B corresponds to the integrated atomic flux at a region 704 at the bottom of the via 710. Similar to the structure shown in FIGS. 6A–6C, but shown in a more normal "layered" configuration, the single damascene structure includes a first line 720 disposed below the via 710, and a second line 730 disposed above the via 710. The via 710 provides the electrical connectivity between the first and second lines 720, 730. SiN (cap) layers 750, 760 are also shown in the interconnect structure of FIGS. 7A and 7B.

The value of the integrated atomic flux corresponds to the net amount of material that is removed from a particular region, and correlates closely to the size of a void that is created in that particular region. As seen in FIG. 7A, for a perfect barrier, the integrated atomic flux is fairly large, resulting in voids being formed in the second line 730 just above the via 710. For a moderate barrier, the atomic flux is smaller, and for a poor barrier, the atomic flux is the smallest. Thus, the poor barrier provides the best performance in terms of void formation at the portion of the second line 730 adjacent to the via 710. Similar results hold true for the bottom region of the via 710 that is just above another barrier that separates the via 710 from the first line 720, as can be discerned from the results shown in FIG. 7B.

Figure 7C:
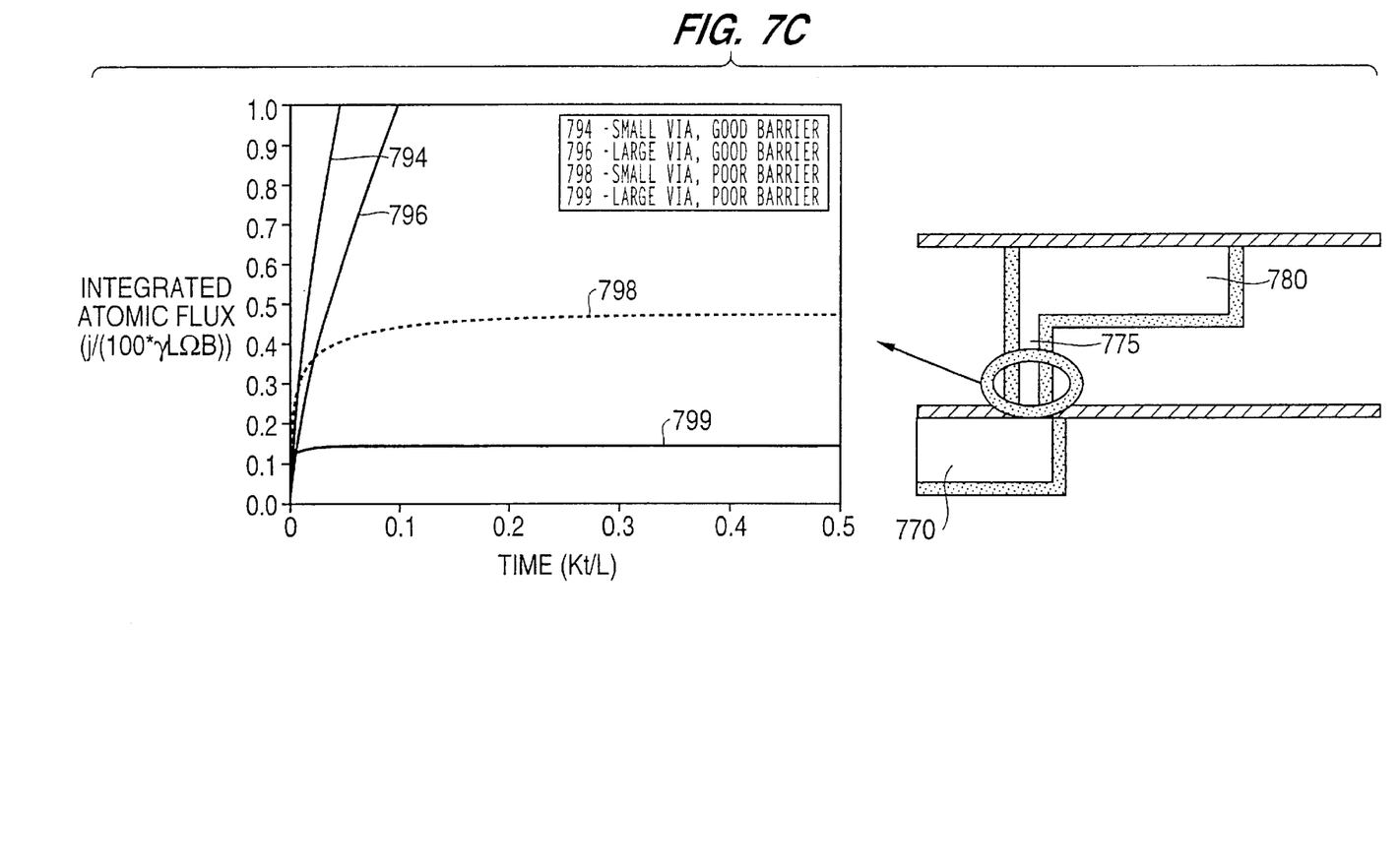
FIG. 7C is a structural diagram and atomic flux plot for a bottom portion of a via formed by a dual damascene process.

FIG. 7C shows the integrated atomic flux for a dual damascene interconnect structure, in which the via and the trench (or line) are filled at the same time. For the dual damascene interconnect structure, only one barrier 760 is formed between a first line 770 (below the via 775) and a second line 780 (above the via 775). The results of FIG. 7C were obtained for two different-sized vias, one large and one small. The sizes of the small and large vias are defined in comparison to the line cross-section in these figures. The large via has the same cross-sectional area as the line, while the small via has one-half the cross-sectional area as the line. For example, for 1 micron wide and 0.5 micron high lines, the large via would have a 0.5 micron$^2$ cross-section, and the small via would have a 0.25 micron$^2$ cross-section. As can be seen from the results in FIG. 7C, while having a larger via is better than having a smaller via in terms of lesser effects due to electromigration, the barrier strength (or lack thereof) is a much more important parameter in reducing the possibility of void formation in interconnect structures.

In FIGS. 7A–7C, the electromigration damage (integrated flux) is smaller in the region of a damascene via if the diffusivity barrier allows some atomic diffusion to take place. However, as noted above with respect to FIGS. 6A–6C, higher atomic diffusion through the barrier also gives rise to higher overall atomic flux. This can give rise to a higher stress build up at the far cathode end of a line that would otherwise be blocked by the via, as will be discussed in detail below.

Figure 8A:
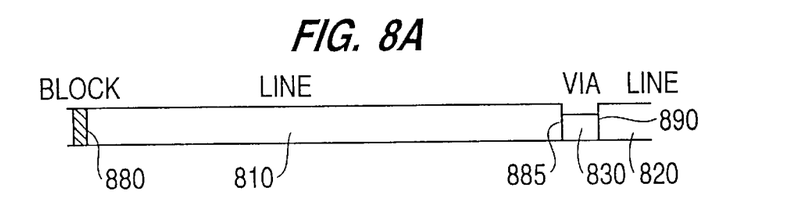
FIG. 8A is a structural diagram to be used in connection with the stress plots of FIGS. 8B and 8C.
Figure 8B:
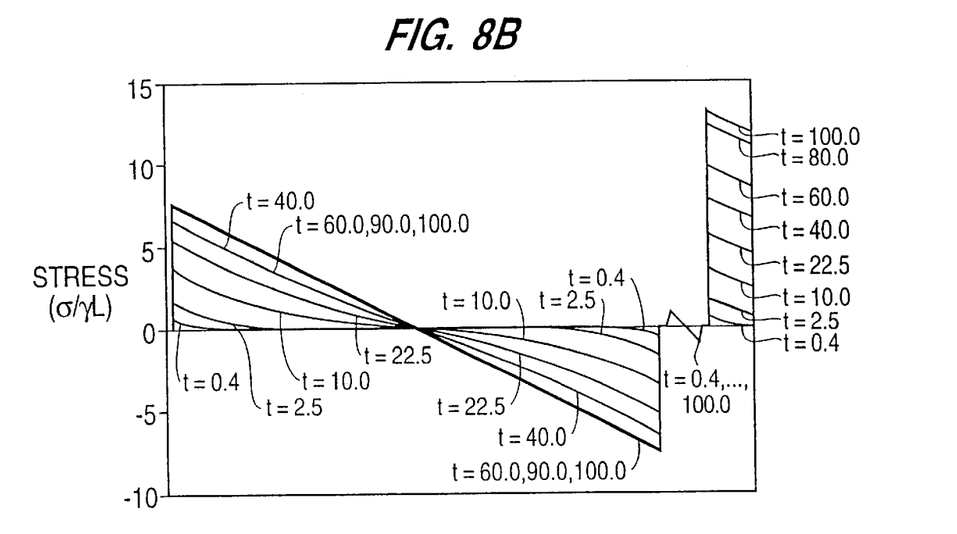
FIG. 8B is a stress plot for a single damascene structure with a perfect barrier.
Figure 8C:
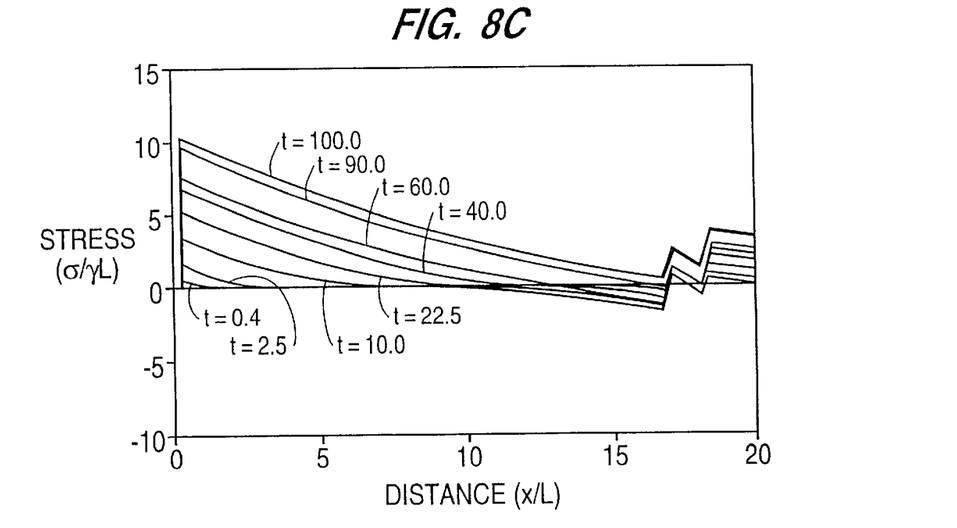
FIG. 8C is a stress plot for a single damascene structure with a imperfect barrier.

FIG. 8A shows a line/via/line single damascene structure, which is shown in horizontal form for ease in explanation (the actual structure is typically layered, as in FIG. 7A, for example, with the via being disposed between lines above and below it), and FIGS. 8B and 8C show the stress levels over time for respective portions of the line/via/line interconnect structure for a perfect barrier and an imperfect barrier, respectively. In the interconnect structure of FIG. 8A, the first line 810 and the second line 820 are of relatively long length, with the via 830 providing the electrical connectivity between these two lines 810, 820.

The block 880 shown at the left side of FIG. 8A may correspond, for example, to a gate, source or drain region of a transistor formed on a substrate, or it may correspond to some other device on the substrate to which an electrical connection is desired to be made.

The block 880 operates as a perfect barrier at one end of the first line 810. In FIG. 8B, the stresses in the first line 810 build up over time, to reach a steady-state stress condition, as indicated by the stress plot for t'=100.0. This steady-state stress condition is reached due to the stress gradient force (moving atoms from right-to-left in the figure) counteracting the electromigration force (moving atoms from left-to-right in the figure). As can be seen from FIG. 8A, the tensile stress level at the block is about 7–8 σ/gL, while the stress levels at the perfect barrier are larger. In this instance, the compressive stress level at the left side of the first barrier is about 7–8 σ/gL, and the tensile stress level at the right side of the second barrier is about 12–13 σ/gL. Normalized or dimensionless units are used in solving the electromigration equations as defined herein. In particular, stress is plotted as σ/gL, where L is the height of a via and g is the electromigration driving force (g=q*E/Ω, where q* is the effective electric charge of the atom, E is the electric field, and Ω is the atomic volume). Also, length is plotted as x/L, and time is plotted as Kt/L$^2$, where K is the effective diffusivity. By using these values, the results can be scaled according to via height, electromigration driving force, and effective diffusivity.

FIG. 8C corresponds to the stress levels for an imperfect barrier, in which the tensile stress level at the block 880 is higher than in the perfect barrier case of FIG. 8B, but where the stress levels around the first and second imperfect barriers 885, 890 are lower than in the perfect barrier case of FIG. 8B. As can be seen from FIG. 8C, unlike the case of FIG. 8B, a steady-state stress condition is not reached in the first line 810, but instead the stresses continue to build up over time. The stress buildup in the line downstream from the via 830 is smaller in the case of an imperfect barrier, although the stress in the via 830 is higher.

Based on this data, if damage (e.g., void formation) near the block 880 is a primary concern (more so than damage at the via 830), then a somewhat perfect barrier at or near the via 830 will be the best approach. On the other hand, if damage at the via 830 is a primary concern (more so than damage at or near the block 880), then a poor barrier at the via 830 will be the best approach. Of course, voids are a concern no matter where they are located, and so the determination of what type of barrier to use (perfect, moderate, poor) in the system and method according to the invention is determined based on the particular characteristics of the existing interconnect structure.

Figure 9A:
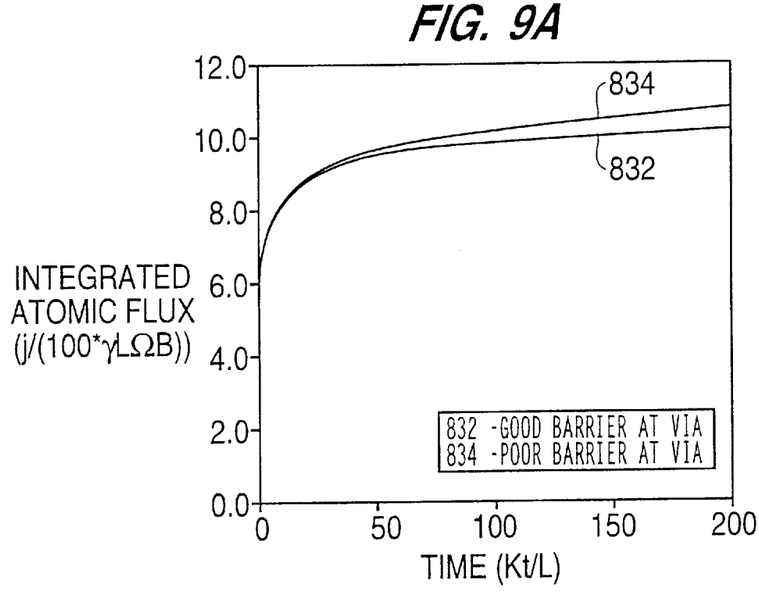
FIG. 9A is an atomic flux plot for a single damascene structure having a metal reservoir according to the invention.
Figure 9B:
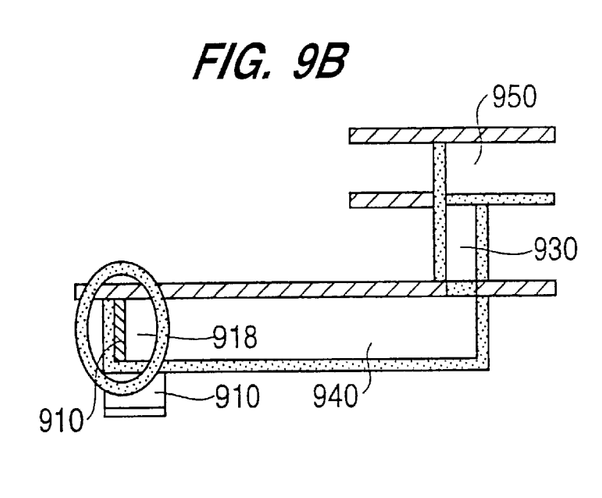
FIG. 9B is a structural diagram to be used with the atomic flux plot of FIG. 9A.

In order to alleviate the stress problem at the block due to the use of an imperfect barrier, as seen from the results shown in FIG. 8C, a second embodiment of the present invention provides a reservoir 910 of metal atoms at a block 920 at the cathode end of a first line 940, as shown in FIG. 9B. This reservoir 910 of metal atoms provides the necessary copper atoms that are lost due to the electromigration of copper atoms away from the block 920 and towards the a via 930 that connects the first line 940 to a second line 950. That way, the possibility of any formation of voids near the block 920 is reduced by providing replacement metal atoms through the reservoir 910, and into the region of the line where the metal atoms were lost due to electromigration.

FIG. 9A shows the integrated atomic flux in the circled region 918 of FIG. 9B for both a good barrier at the via 930 and for a poor barrier at the via 930. The plots in FIG. 9A are for a case where no reservoir is provided at the block on the first line 940, as can be seen from the interconnect structure of FIG. 8B, but without the reservoir 910 being provided. The metal reservoir 910 may be a pad of copper, for example. As can readily be seen in FIG. 9A, the integrated atomic flux density is lesser for the case of the perfect barrier than for the case of an imperfect barrier. That is, the atomic flux density flattens out for the perfect barrier case, reaching a steady-state condition, in which the atomic flux is around $8-9$ $j/(100*\gamma L \Omega B)$. The atomic flux is a dimensionless unit, where j is the current density, $\gamma=g$ is the electromigration driving force, L is the length of the via, $\Omega$ is the atomic volume, and B is an effective bulk modulus of the metal. These values are used so that the results can be scaled. For the case of a perfect barrier, the stress gradient builds up to a point where it counteracts the electromigration force, to reach the steady-state condition. By providing a reservoir that replaces the metal atoms at about this same rate as the steady-state integrated atomic flux, void formation due to electromigration can be suppressed. For a case where the reservoir 910 is provided at the block on the first line 940, as shown in FIG. 9B, the stresses in the line will be smaller but the flux will be larger.

Thus, from FIGS. 8A, 8B, 9A and 9B, the present invention provides an imperfect barrier for a single or dual-damascene interconnect structure in which there is no block provided not-to-far upstream with respect to the interconnect structure. Also, the present invention provides a perfect barrier (or substantially perfect barrier) for a single or dual-damascene interconnect structure in which there is a block provided not-to-far upstream with respect to the interconnect structure.

The present invention according to the second embodiment provides a metal reservoir adjacent to a block at the cathode end of a line, in order to alleviate any possibility of void formation due to having the perfect barrier. Of course, the metal reservoir may be utilized with a perfect barrier, a moderate barrier or a poor barrier according to the first embodiment of the present invention, in order to lessen the likelihood of void formation in the line at or near the block.

Figure 10A:
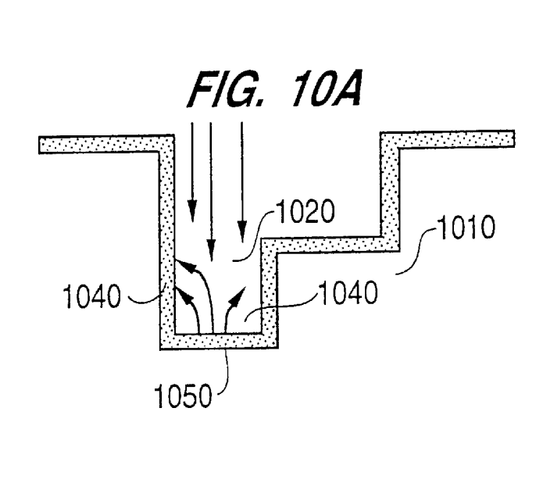
FIG. 10A is a structural diagram for explaining a first method of creating a controlled diffusivity barrier according to the invention.

FIGS. 10A–10D show three different methods of providing an imperfect barrier layer in accordance with the present invention. In FIG. 10A, as a first method, an electrical bias is applied to a wafer 1010. When the metal atoms used to create the barrier layer are implanted onto the wafer 1010, the electrical bias causes the metal atoms to be pulled down towards the wafer 1010 faster than if no bias was applied to the wafer 1010. The metal atoms approach the wafer 1010 at rapid speed and some bounce off the surface of the wafer 1010, causing a resputtering of those atoms onto the sidewalls 1040 of the via 1020. That way, the thickness of the barrier layer is greater at the sidewalls 1040 of the via 1020 than at the bottom surface 1050 of the via 1020. This creates an imperfect barrier at the bottom surface of the via 1020. If the atoms are applied at an offset angle to the via and the trench, the bottom portions of the sidewalls of the via 1020 will not get much atoms applied thereto, due to blockage caused by the angle of incidence and the thin width of the via 1020.

By applying a bias to the wafer according to the first method, the atoms impinging on the bottom surface of the wafer 1010 will resputter and adhere to the bottom portions of the sidewalls 1040 of the via 1020, creating a somewhat uniform barrier layer thickness for the sidewalls 1040. The upper portions of the sidewalls 1040 receive more atoms than the bottom portions of the sidewalls 1040 as a result of the direct bombardment of the atoms towards the wafer 1010, but the bias applied to the wafer causes extra atoms that directly impinge on the bottom surface of the via 1020 to bounce off the bottom surface and adhere to the bottom portions of the sidewalls 1040. The technique for sputtering atoms onto a biased wafer can be done via an IMP technology, for example.

Figure 10B:
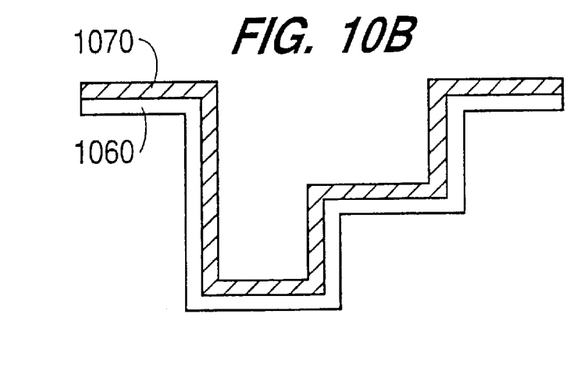
FIG. 10B is a structural diagram for explaining a second method of creating a controlled diffusivity barrier according to the invention.

FIG. 10B shows a second method for creating an imperfect diffusion barrier according to the invention. At a first step, a poor diffusion barrier 1060 is deposited onto the wafer using a conformal technique. As an alternative first step, no diffusion barrier is deposited onto the wafer. At a next step, a poor step coverage technique is used, such as PVD, for providing a strong barrier 1070. This dual-layered barrier will limit diffusion from the sidewall while allowing diffusion at the bottom of the via. The poor diffusion barrier metal may correspond to TiN, for example, and the good diffusion barrier metal may correspond to TaN, for example.

Figure 10C:
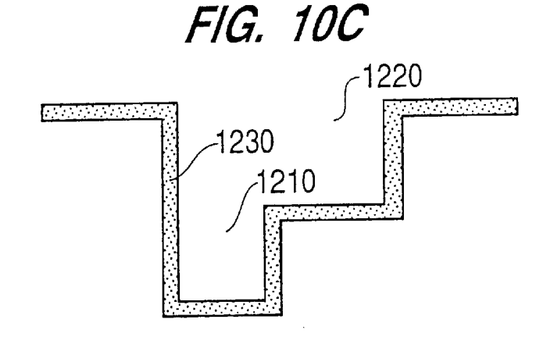
FIGS. 10C and 10D are structural diagrams for explaining a third method of creating a controlled diffusivity barrier according to the invention.
Figure 10D:
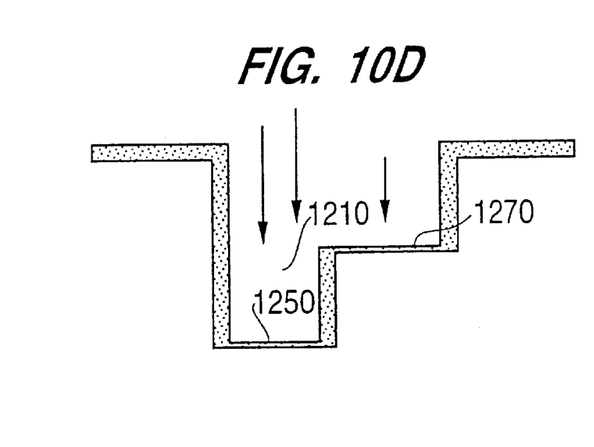

FIGS. 10C and 10D show steps of a third method for creating an imperfect diffusion barrier according to the invention. At a first step, as shown in FIG. 10C, a conformal barrier 1230 is deposited on the surfaces of a via 1210 and a trench 1220. Such a conformal barrier may be TiN or TaN deposited by chemical vapor deposition, as an example. At a next step, as shown in FIG. 10D, a directional etch is performed to remove some barrier material from the bottom 1250 of the via 1210. Such a directional etch may be a biased plasma etch, for example. Some barrier material may also be removed from the bottom 1270 of the trench, due to the directional etch.

While preferred embodiments have been described herein, modification of the described embodiments may become apparent to those of ordinary skill in the art, following the teachings of the invention, without departing from the scope of the invention as set forth in the appended claims.

As described above, a particular type of barrier may be utilized in order to achieve desired characteristics (e.g., reduced stress at the via, reduced stress at the end of a line). Factors that affect the barrier properties of a barrier layer include composition, structure, and thickness/uniformity. TaN acts as a very good barrier because it tends to be amorphous or have only very small crystals. The barrier properties of TaN can vary depending on the nitrogen content and deposition conditions. Ta also acts as a good barrier (although not typically as good as TaN), with the advantage that it gives better (111) texture to the overlying copper. TiN is usually an adequate barrier, but it is not as good as Ta or TaN. Also, Chemical Vapor Deposition gives a more amorphous (and better barrier) TiN than Physical Vapor Deposition, in general.

Furthermore, it is possible to deposit multi-layers for a barrier. For example, a barrier may be composed of Ta/TaN/

Ta as a tri-layer barrier. Thicker films are better barriers in general, although as the film gets to be about 200–300 angstroms thick, the thickness effect becomes less important.

Also, a metal reservoir located at the end of a line (see FIG. 9B) can be utilized with either a perfect barrier or an imperfect barrier at the via. The metal reservoir serves as an atomic source/sink, providing needed metal atoms at the end of the line (where the block exists).

As explained above, depending on the actual interconnect layout and the desired areas where voids are to be reduced and/or eliminated, either a perfect barrier, a moderate barrier, or a poor barrier at the via may be desirable. The moderate barrier provides a compromise solution in which both the blocked end of a line and the via show moderate stress increase and void growth, but neither show it to the same extent as: a) the blocked end for a poor barrier case, or b) the via for a perfect barrier case. Thus, the use of a moderate barrier may allow both regions to fall below a threshold failure value.

What is claimed is:

1. A method of creating a damascene interconnect for a semiconductor device having a first conductive line, a second conductive line, and a via electrically connecting the first and second conductive lines, the first conductive line having a device located at one end thereof, the method comprising the steps of:

a) determining whether void formation at the device is of higher or of lower importance than void formation at the via;

b) providing a diffusivity barrier layer having one of a first and second ability to prevent diffusion at an interface between the first conductive line and the via, wherein the first ability to prevent diffusion is greater than the second ability to prevent diffusion; and c) applying a reservoir of a first metal conductor at the one end of the first conductive line, the first metal conductor being of a same type as a second metal conductor disposed within the via and the first conductive line, wherein the reservoir of the first metal conductor provides metal atoms that are depleted from a region of the first conductive line adjacent to the device, the metal atoms acting as replacements for any metal atoms within the first metal conductor that have been moved in a direction away from the device, and wherein, if the determination in step a) is that void formation at the device is of higher importance than void formation at the via, the diffusivity barrier layer having the second amount of diffusivity is provided in step b), so that void formation at the device is minimized at the expense of void formation at the via, and wherein, if the determination in step a) is that void formation at the device is of lower importance than void formation at the via, the diffusivity barrier layer having the first amount of diffusivity is provided in step b), so that void formation at the via is minimized at the expense of void formation at the device.

2. The method according to claim 1, wherein the metal atoms are copper atoms.

3. The method according to claim 1, wherein the step b) comprises the steps of:

b1) depositing a barrier metal conformally onto the via; and b2) directionally etching the deposited barrier metal to thereby etch surfaces of the via that are substantially perpendicular to a direction in which the barrier metal was deposited in the step b1.

4. The method according to claim 3, wherein the directional etching step b2) is a biased plasma etch.

5. A method according to claim 3, wherein, after the step b2) is concluded, the barrier metal forms a region that is thicker on sidewalls on the via than it is on a bottom surface of the via, wherein the sidewalls of the via are substantially parallel to the direction in which the barrier metal was deposited in the step b1), and wherein the bottom surface of the via is substantially perpendicular to the direction in which the barrier metal was deposited in the step b2).

* * * * *